United States Patent
Liang et al.

(10) Patent No.: US 8,815,660 B2
(45) Date of Patent: Aug. 26, 2014

(54) STRUCTURE AND METHOD FOR REDUCING FLOATING BODY EFFECT OF SOI MOSFETS

(75) Inventors: Qingqing Liang, Fishkill, NY (US); Huilong Zhu, Poughkeepsie, NY (US); Zhijiong Luo, Carmel, NY (US); Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1239 days.

(21) Appl. No.: 12/700,797

(22) Filed: Feb. 5, 2010

(65) Prior Publication Data

US 2011/0193166 A1  Aug. 11, 2011

(51) Int. Cl.
*H01L 29/786*  (2006.01)

(52) U.S. Cl.
USPC ........... 438/163; 438/162; 438/301; 257/347; 257/348; 257/386; 257/E21.633; 257/E29.279

(58) Field of Classification Search
USPC .......... 438/163, 162, 301; 257/347, 348, 386, 257/E21.633, E29.279
See application file for complete search history.

(56) References Cited

U.S. PATENT DOCUMENTS

| | | | |
|---|---|---|---|
| 5,189,500 A * | 2/1993 | Kusunoki | 349/17 |
| 5,578,865 A * | 11/1996 | Vu et al. | 257/611 |
| 6,479,868 B1 | 11/2002 | An et al. | |
| 6,534,373 B1 | 3/2003 | Yu | |
| 6,706,614 B1 | 3/2004 | An et al. | |
| 6,774,436 B1 | 8/2004 | Yu et al. | |
| 7,239,549 B2 | 7/2007 | Fazan et al. | |
| 7,410,876 B1 | 8/2008 | Min et al. | |
| 8,138,029 B2 * | 3/2012 | Zhu et al. | 438/149 |
| 8,587,066 B2 * | 11/2013 | Zhu et al. | 257/347 |
| 2006/0128105 A1 * | 6/2006 | Ouyang et al. | 438/300 |
| 2006/0273391 A1 | 12/2006 | Diaz et al. | |
| 2007/0254422 A1 * | 11/2007 | Chidambarrao et al. | 438/197 |
| 2008/0150026 A1 | 6/2008 | Kwon et al. | |
| 2008/0164491 A1 * | 7/2008 | Liu et al. | 257/190 |
| 2009/0032845 A1 | 2/2009 | Zhu et al. | |

OTHER PUBLICATIONS

Liu Yunlong et al. "Floating Body Effect in Partially Depleted SOI nMOSFET with Asymmetric Structure and Ge-Implantation" vol. 23, No. 11, Nov. 2002, pp. 1154-1157.
R. Yang et al. "An Asymmetrical Source/DrainJunction Structure for SOI RFIC: Immune to Floating Body Effects" 2004, pp. 273-276.

* cited by examiner

*Primary Examiner* — Michael Jung
*Assistant Examiner* — John P Dulka
(74) *Attorney, Agent, or Firm* — Steven Meyers; Roberts Mlotkowski Safran & Cole, P.C.

(57) ABSTRACT

The present invention generally relates to a semiconductor structure and method, and more specifically, to a structure and method for reducing floating body effect of silicon on insulator (SOI) metal oxide semiconductor field effect transistors (MOSFETs). An integrated circuit (IC) structure includes a SOI substrate and at least one MOSFET formed on the SOI substrate. Additionally, the IC structure includes an asymmetrical source-drain junction in the at least one MOSFET by damaging a pn junction to reduce floating body effects of the at least one MOSFET.

12 Claims, 10 Drawing Sheets

STRUCTURE AND METHOD FOR REDUCING FLOATING BODY EFFECT OF SOI MOSFETS

FIELD OF THE INVENTION

The present invention generally relates to a semiconductor structure and method, and more specifically, to a structure and method for reducing floating body effect of SOI MOSFETs.

BACKGROUND

Silicon on insulator technology (SOI) refers to the use of a layered silicon-insulator-silicon substrate in place of conventional silicon substrates in semiconductor manufacturing, for example, to reduce parasitic device capacitance and thereby improve performance. SOI-based devices differ from conventional silicon-built devices in that the silicon junction is above an electrical insulator, e.g., silicon dioxide.

A metal-oxide-semiconductor field-effect transistor (MOSFET) is a device that, for example, may be used to amplify or switch electronic signals. The MOSFET includes a channel of n-type or p-type semiconductor material, and is accordingly called an NMOSFET or a PMOSFET (also commonly known as nMOS, pMOS). For example, if the MOSFET is an n-channel or nMOS FET, then the source and drain are "n+" regions and the body is a "p" region. With sufficient gate voltage, above a threshold voltage (Vt) value, electrons from the source (and possibly also the drain) enter the inversion layer or n-channel at the interface between the p region and the oxide. This conducting channel extends between the source and the drain, and current is conducted through it when a voltage is applied between the source and drain.

The floating body effect is the effect of dependence of the body potential of a transistor realized by the silicon on insulator (SOI) technology on the history of its biasing and the carrier recombination processes. The transistor's body forms a capacitor against the insulated substrate. The charge accumulates on this capacitor and may cause adverse effects, for example, opening of parasitic transistors in the structure and causing off-state leakages, resulting in higher current consumption. The floating body effect also causes the history effect, which is a dependence of the threshold voltage (Vt) of the transistor on the transistor's previous states.

However, the floating body effect of an SOI MOSFET can shift threshold voltage (Vt) and/or increase Vt variation, which degrades integrated circuit (IC) yields. One countermeasure to floating body effect involves use of fully depleted (FD) devices. The insulator layer in FD devices is significantly thinner than the channel depletion width. The charge, and thus also the body potential, of the transistors is therefore fixed. However, the short-channel effect is worsened in the FD devices, i.e., the body may still charge up if both source and drain are high, such that the architecture is unsuitable for some analog devices that require contact with the body.

Accordingly, there exists a need in the art to overcome the deficiencies and limitations described hereinabove.

SUMMARY

In a first aspect of the invention, a method of making an integrated circuit (IC) structure. The method comprises providing a silicon on insulator (SOI) substrate and forming at least one metal oxide semiconductor field effect transistor (MOSFET) on the SOI substrate. Additionally, the method comprises forming an asymmetrical source-drain junction in the at least one MOSFET by damaging a pn junction to reduce floating body effects of the at least one MOSFET.

An additional aspect of the invention includes an integrated circuit (IC) structure comprising a silicon on insulator (SOI) substrate and at least one metal oxide semiconductor field effect transistor (MOSFET) formed on the SOI substrate. Additionally, the IC structure comprises an asymmetrical source-drain junction in the at least one MOSFET structured to reduce floating body effects of the at least one MOSFET.

In an additional aspect of the invention, a method comprises forming at least one metal oxide semiconductor field effect transistor (MOSFET) on a silicon on insulator (SOI) substrate and masking a portion of the at least one MOSFET. Additionally, the method comprises implanting a dopant in an unmasked portion of the MOSFET to form an asymmetrical source-drain junction in the at least one MOSFET structured to reduce floating body effects of the at least one MOSFET.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention generally relates to a semiconductor structure and method, and more specifically, to a structure and method for reducing floating body effect of SOI MOSFETs. In embodiments, the present invention takes advantage of three-dimensional (3D) integration to produce asymmetrical junction leakage, which reduces threshold voltage (Vt) variation.

In semiconductor devices, leakage is a quantum phenomenon where mobile charge carriers (electrons or holes) tunnel through an insulating region. Leakage increases exponentially as the thickness of the insulating region decreases. Tunneling leakage can also occur across semiconductor junctions (i.e., junction leakage) between heavily doped P-type and N-type semiconductors.

Implementing the present invention provides for increased integrated circuit (IC) yields for SOI MOSFETs. For example, by implementing the present invention, a damaged pn junction is provided in combination with an undamaged pn junction, which provides an asymmetrical junction leakage. Moreover, the asymmetrical junction leakage reduces threshold voltage (Vt) variation. Thus, implementing the present invention provides for increased IC yields for SOI MOSFETs.

Figure 10:
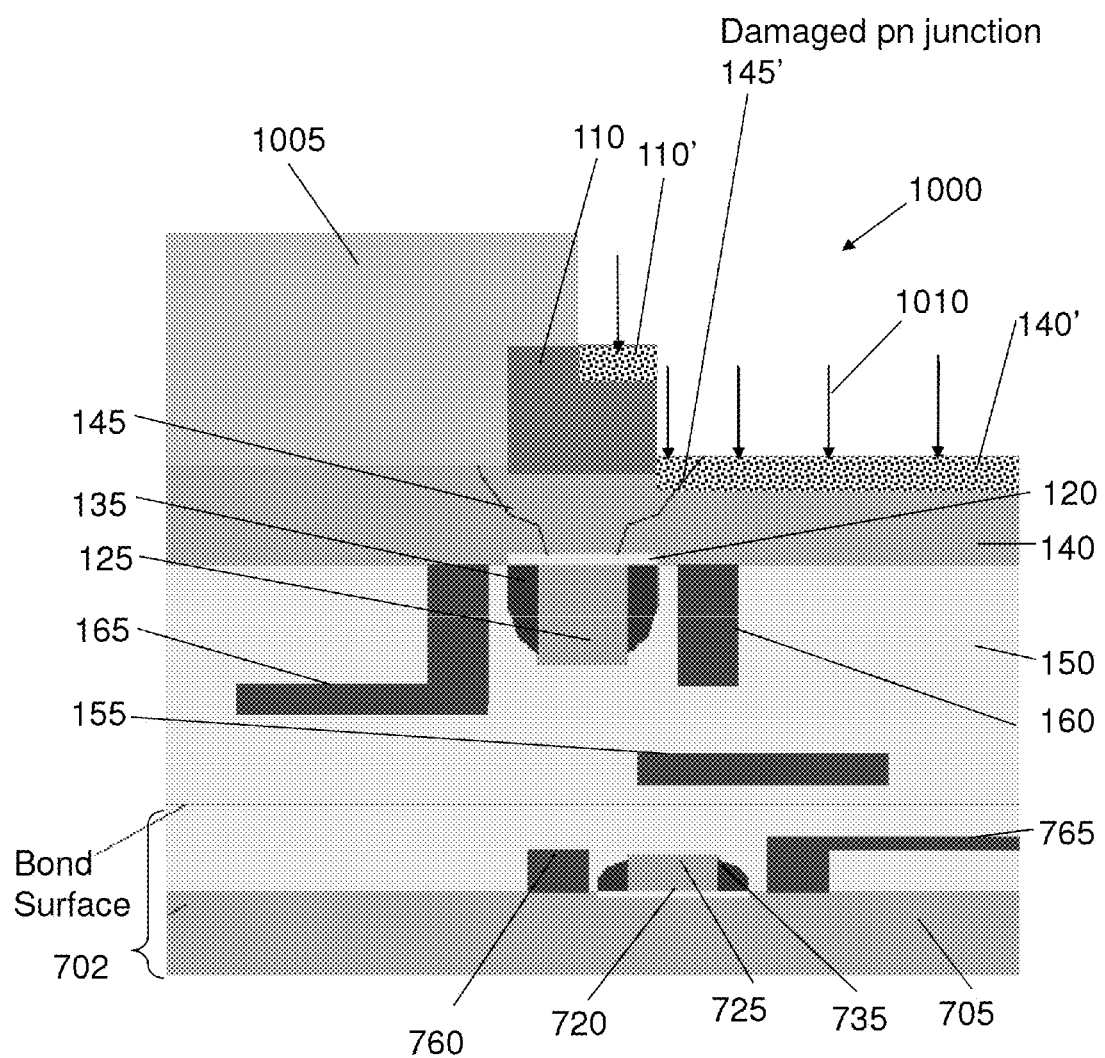
Figure 11:
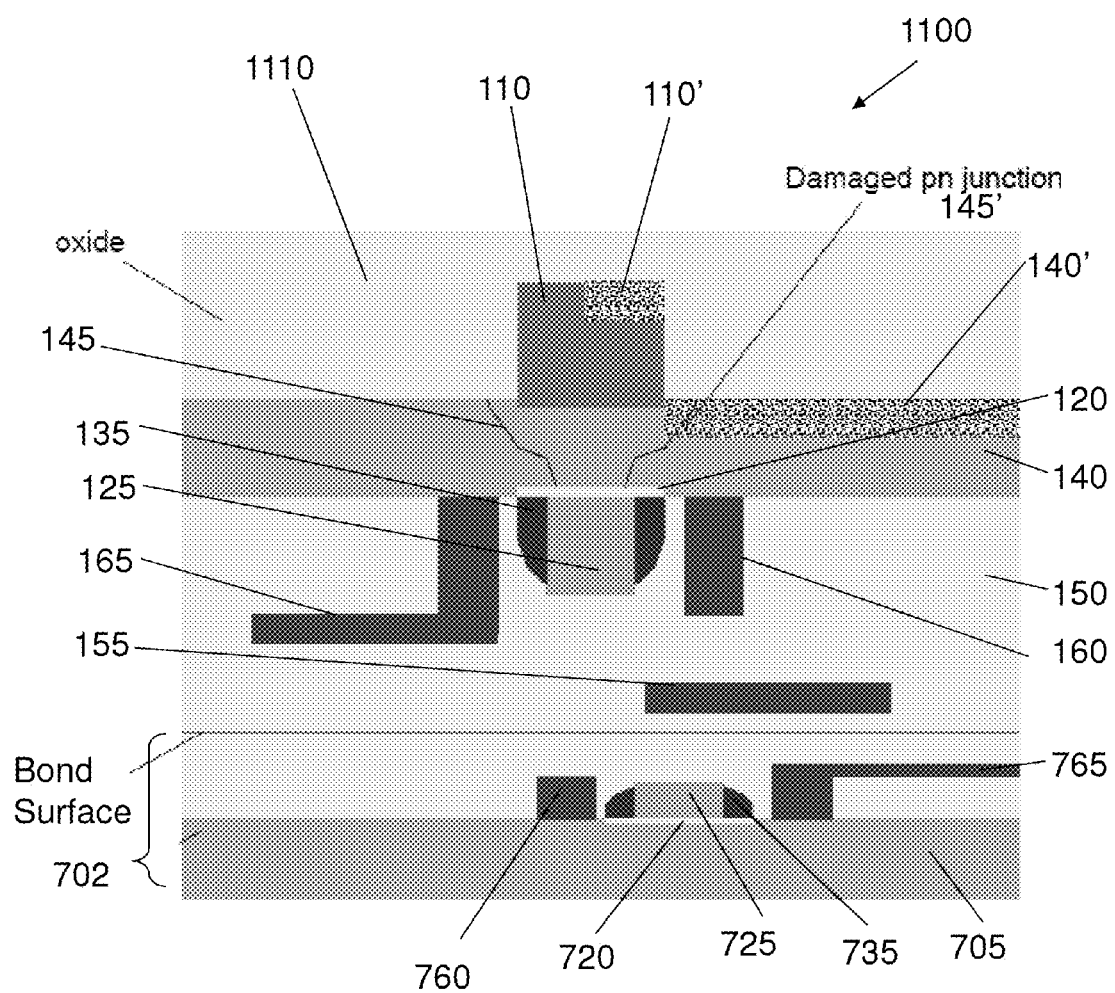
Figure 12:
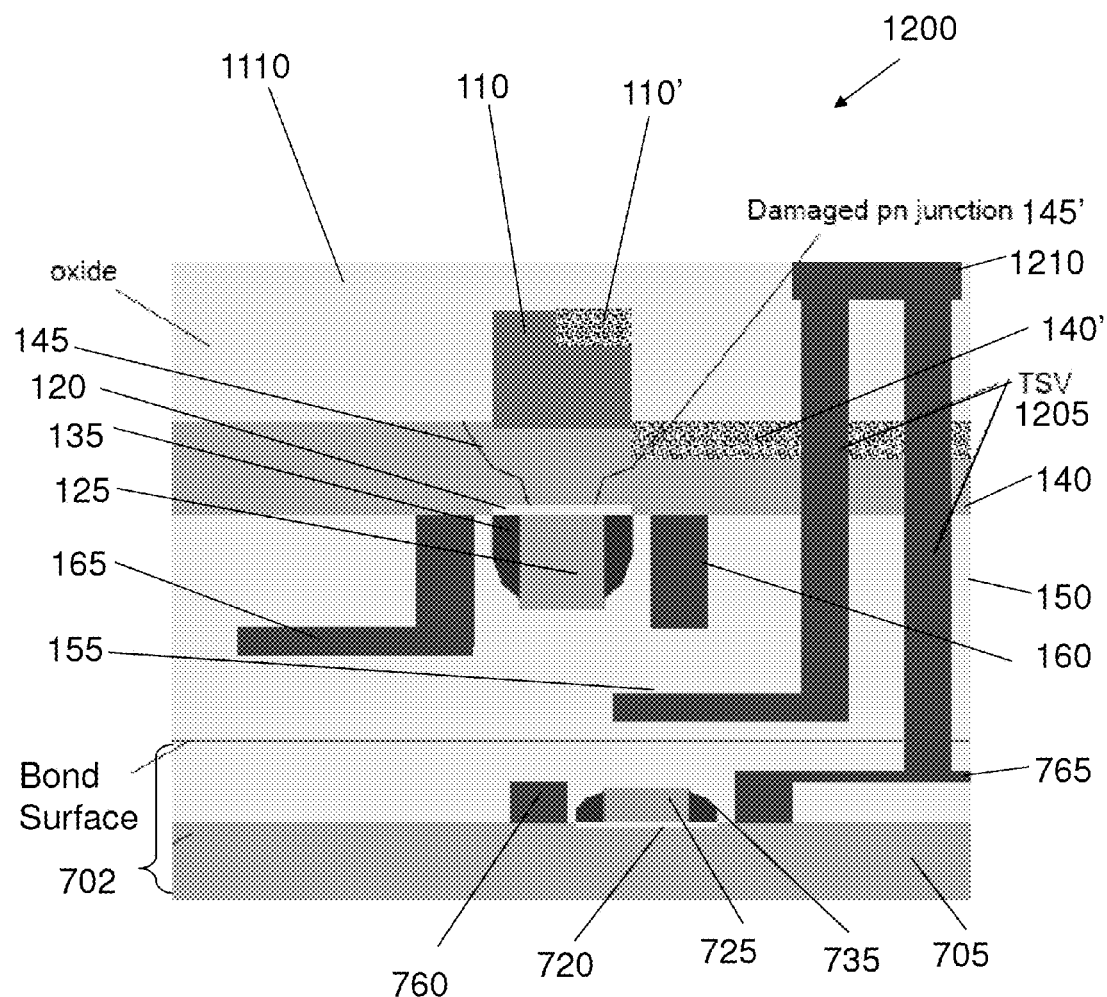
FIG. 12 shows a sectional view of an exemplary structure in accordance with aspects of the invention.

FIGS. 1-11 show intermediate structures and respective processing steps used to form the structure 1200 of FIG. 12. As shown in the intermediate structure 100 of FIG. 1, a bulk wafer 117, e.g., an SOI, is provided. In embodiments, the bulk wafer 117 comprises, for example, a Si substrate 105, an epitaxial SiGe layer 110 formed on the Si substrate 105, and an epitaxial Si layer 115 formed on the epitaxial SiGe layer 110.

Figure 1:
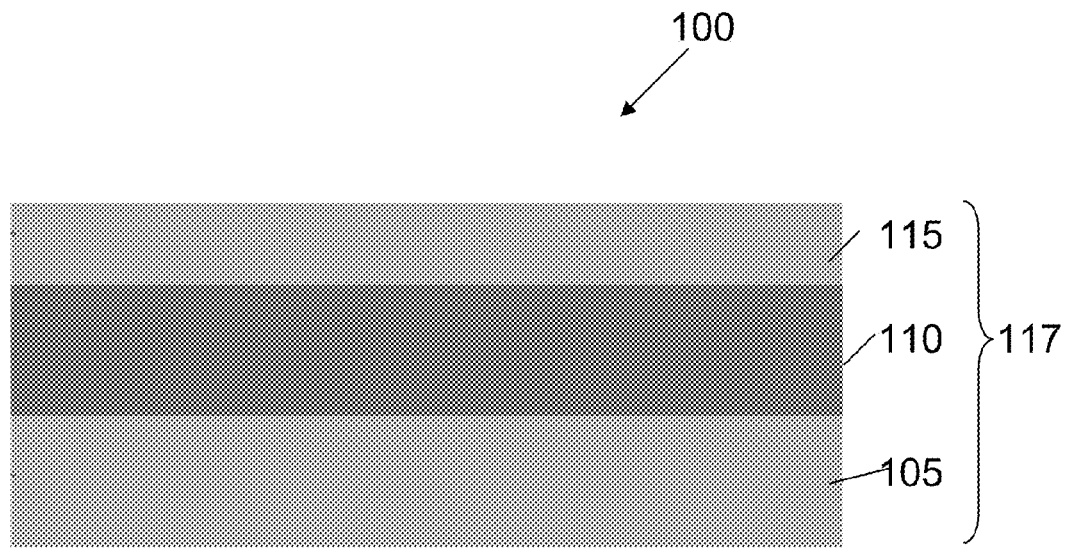
FIGS. 1-11 show exemplary processing steps and related structures used to form the exemplary structure shown in FIG. 12 in accordance with aspects of the invention.
Figure 2:
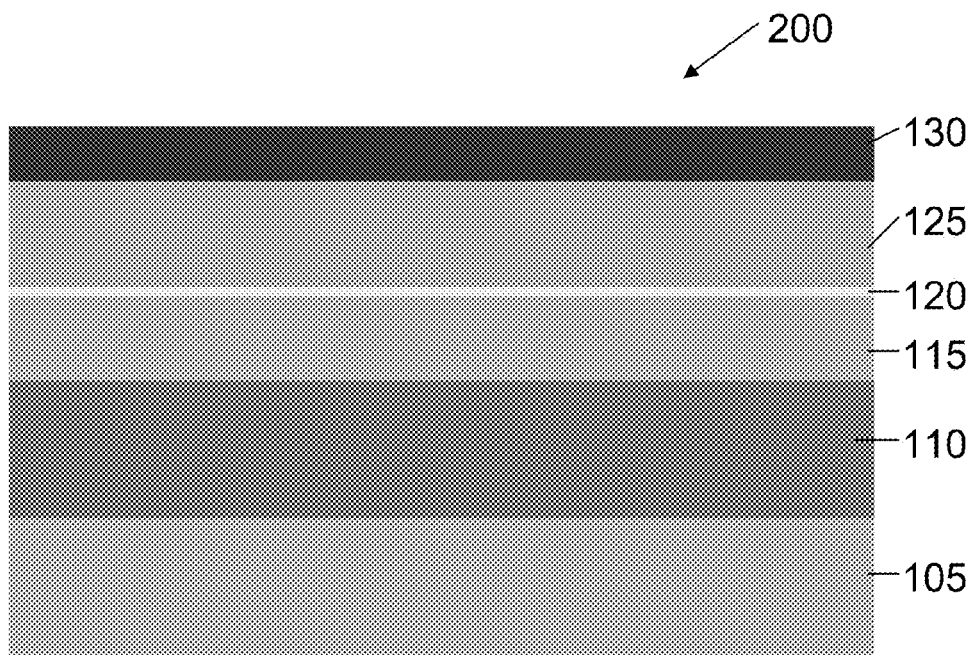

As shown in the intermediate structure 200 of FIG. 2, a gate oxide (e.g., silicon oxide) layer 120 is formed on the epitaxial Si layer 115. The oxide layer 120 may range from about 11 Å to about 55 Å in thickness. Additionally, a poly-Si layer 125 and a nitride layer 130 are deposited (e.g., a chemical vapor deposition) on the gate oxide layer 120. The deposits of material can be by any conventional deposition method, such as, for example, chemical vapor deposition (CVD) or plasma-enhanced chemical vapor deposition (PECVD).

Figure 3:
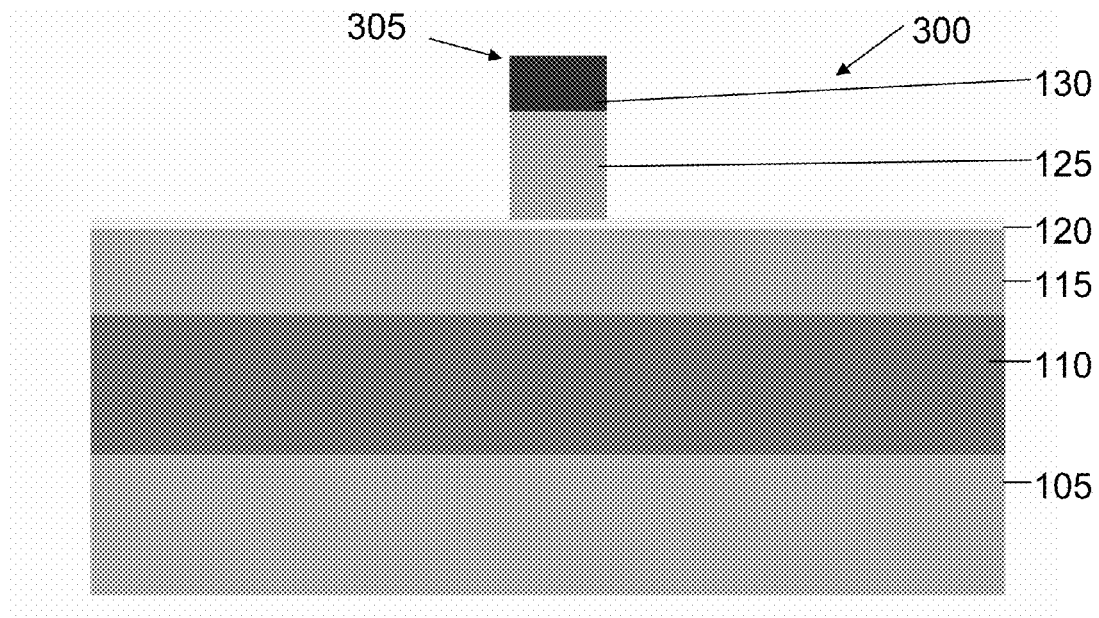

As shown in the intermediate structure 300 of FIG. 3, a gate 305 is patterned from portions of the poly-Si layer 125 and the nitride layer 130. The patterning can be performed using any conventional photolithographic and etching methods well understood by those having ordinary skill in the art.

Figure 4:
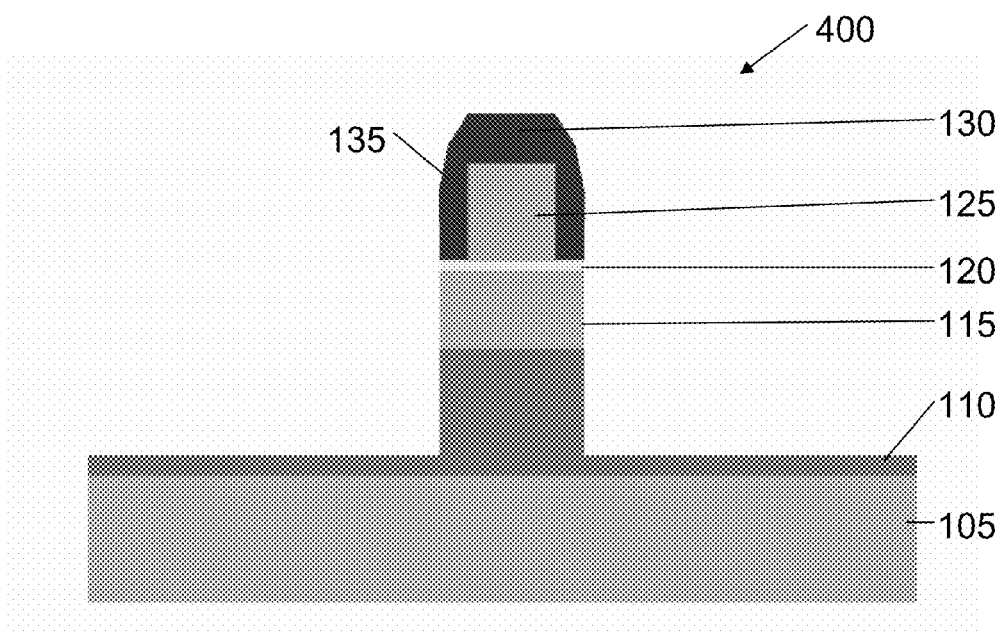

As shown in the intermediate structure 400 of FIG. 4, nitride spacers 135 are formed along the sides of the gate 125 in a manner well understood by those having ordinary skill in the art. For example, the nitride spacers 135 can be formed using conventional deposition processes. Additionally, portions of the dielectric layer 120, the SiGe layer 110 and the Si layer 115 are etched using photolithographic and etching (e.g., reactive ion etch (RIE)) methods, well understood by those having ordinary skill in the art. The nitride spacers 135 will act as a hardmask or cap layer, protecting the gate 305 during the etching step.

Figure 5:
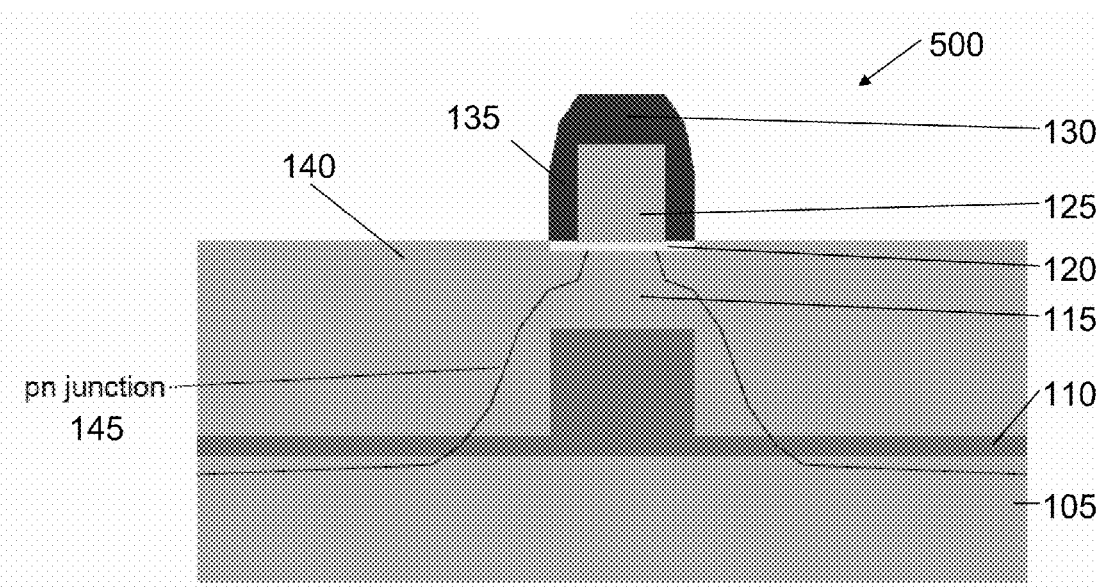

As shown in the intermediate structure 500 of FIG. 5, an epitaxial Si layer 140 is formed on the SiGe layer 110 so as to enclose the remaining portion of the epitaxial Si layer 115. Additionally, FIG. 5 illustrates a pn-junction 145 of the intermediate structure 500.

Figure 6:
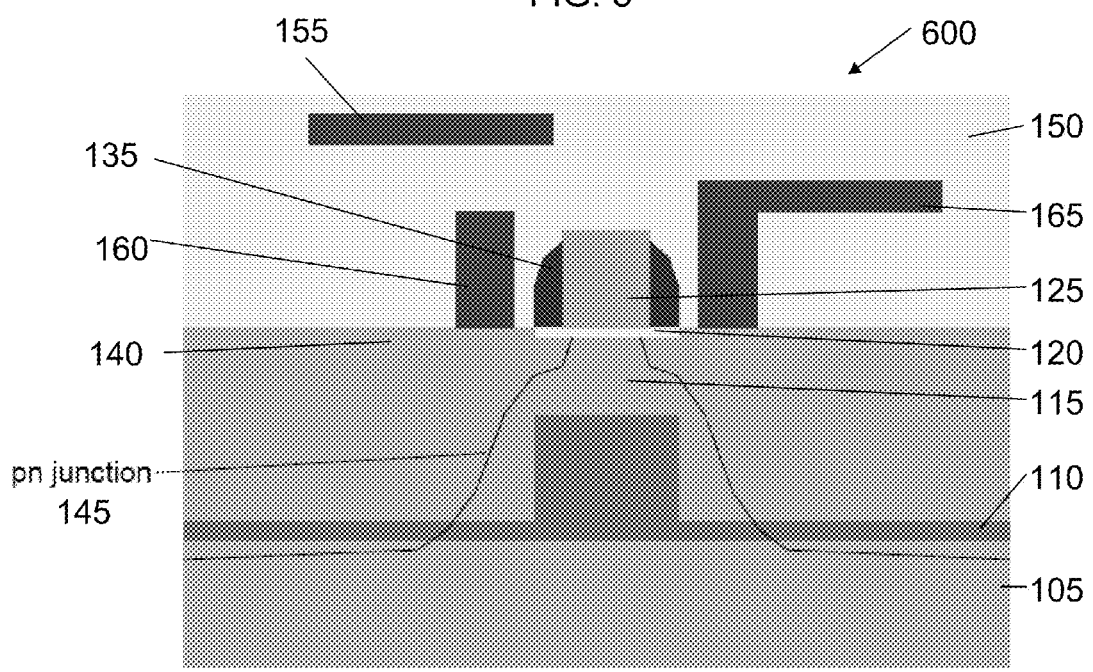

As shown in the intermediate structure 600 of FIG. 6, the building of the front end of line (FEOL) and back end of line (BEOL) is completed with conventional methods, which may include, for example, dual damascene processes. For example, insulator layers 150 (e.g., SiO) are deposited over the structure 500 of FIG. 5. After deposit of a lower layer, contacts 160 and 165 are deposited in openings of the insulator layer 150 using conventional methods (e.g., photolithography, etching and damascene processes). After formation of the contacts 160 and 165, additional insulator material 150 is deposited, and contact 155 is thereafter formed using conventional etching and photolithographic process. A last layer of insulator material 150 is deposited on the structure 600. In embodiments, the contacts may be a metal (e.g., copper) or another suitable material.

Figure 7:
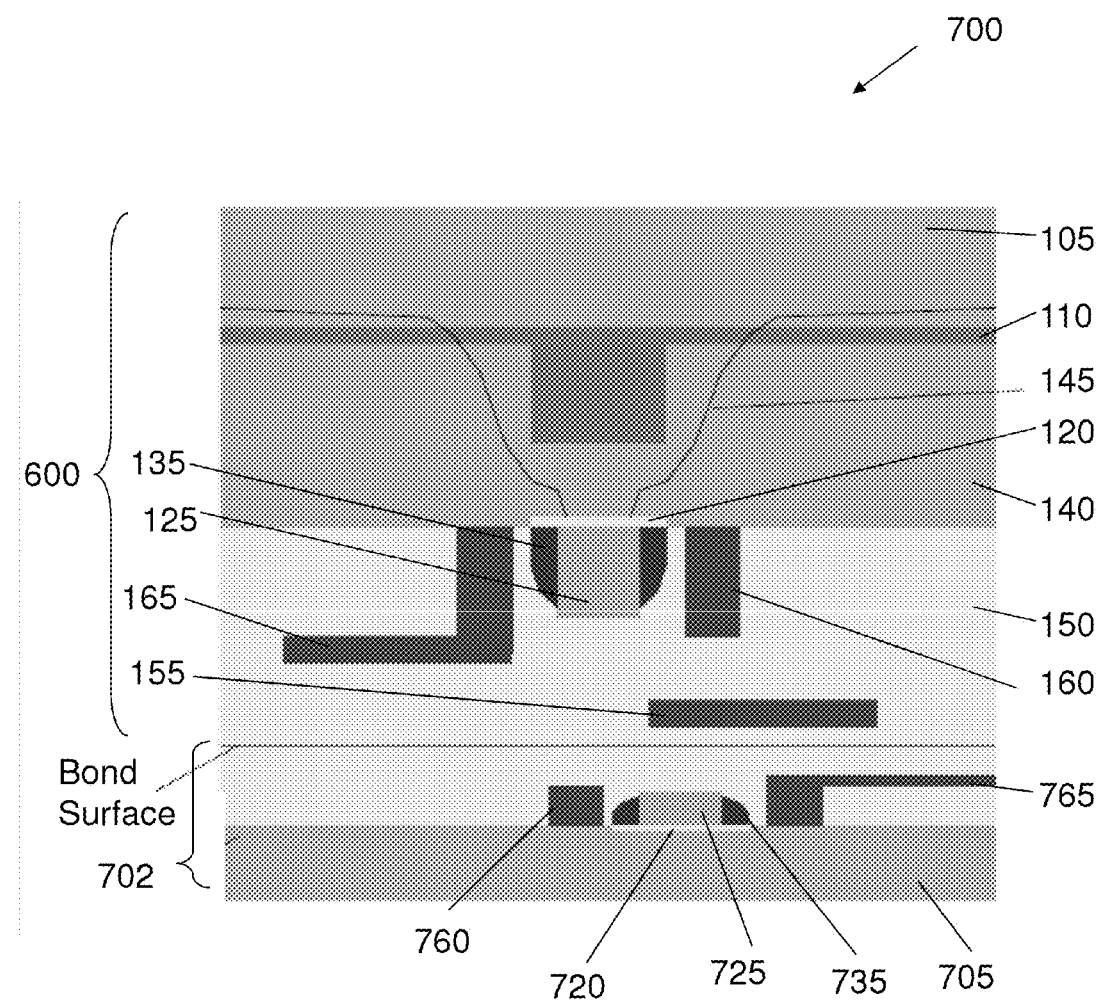

As shown in the intermediate structure 700 of FIG. 7, the intermediate structure 600 is flipped and bonded to a second wafer 702 along a bond surface, using conventional bonding methods. As should be understood, the second wafer may be formed using methods, as described with regard to structures 100-600. However, as shown in FIG. 7, wafer 2 includes a gate structure 725 (including gate dielectric layer 720, gate 725 and sidewalls 735) and contacts 760 and 765, which, in embodiments, may be formed on a Si substrate 705 (in contrast to the SOI substrate of FIG. 1).

Figure 8:
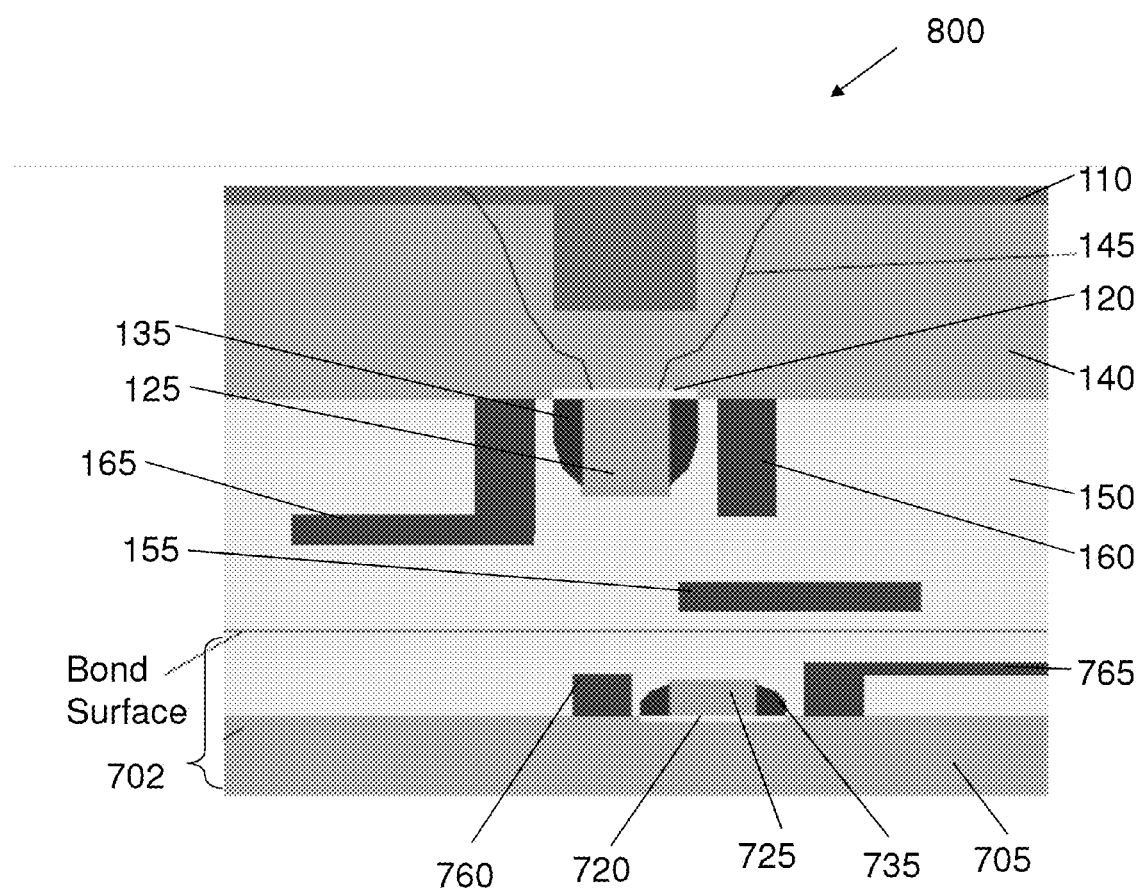

As shown in the intermediate structure 800 of FIG. 8, the Si layer (105) is etched, which is selective to the SiGe layer 110. As such, silicon layer (105) is removed while, for example, most or all of the SiGe layer 110 remains intact. Additionally, the remaining SiGe layer 110 is planarized, e.g., with a grinding and/or a chemical mechanical polishing, as well understood by those having ordinary skill in the art.

Figure 9:
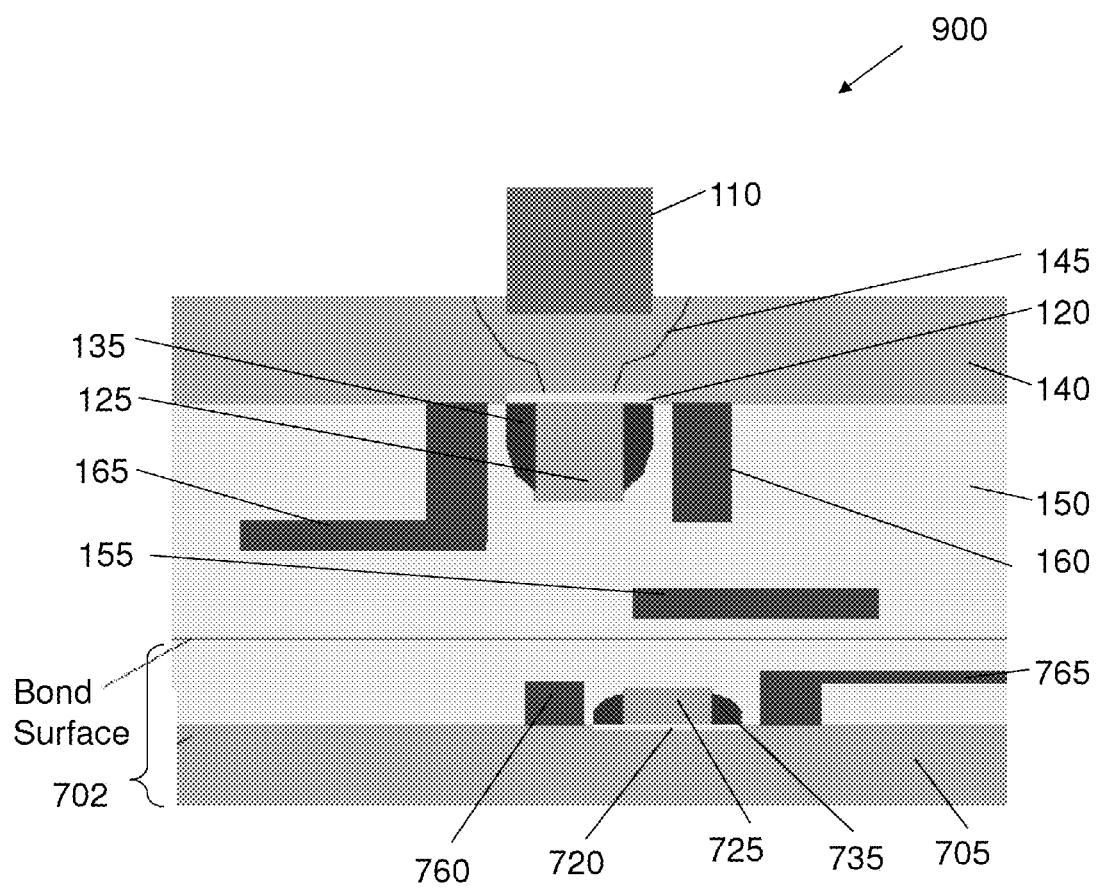

As shown in the intermediate structure 900 of FIG. 9, a top portion of the SiGe layer 110 is etched using conventional etching techniques until Si layer 140 is exposed. Additionally, as shown in FIG. 9, a portion of the Si layer 140 is etched using an etchant that is selective to the SiGe layer 110.

As shown in the intermediate structure 1000 of FIG. 10, a photoresist 1005 is patterned over one side of the intermediate structure 1000 using conventional photolithographic and masking techniques. Subsequently, a dopant, such as Ge implant 1010, is implanted into the exposed side of the intermediate structure 1000 to dope exposed portions of the SiGe layer 110 and the Si layer 140.

As shown in FIG. 10, the portions of the SiGe layer 110 and the Si layer 140 exposed by the photoresist 1005 are doped with the implanted Ge 1010 to form altered regions 110' and 140' (with other suitable dopants contemplated by the invention). Additionally, as shown in FIG. 10, the altered region 140' has "damaged" or altered the pn junction on the doped side of the intermediate structure 1100, thus forming a damaged pn junction 145' in accordance with aspects of the invention.

As shown in the intermediate structure 1100 of FIG. 11, the photoresist 1005 (not shown in FIG. 11) is removed using conventional methods. An oxide layer 1110 is deposited on the Si layer 140 and the SiGe layer 110 to enclose the SiGe layer 110 therein. Additionally, the oxide layer 1110 is planarized, e.g., using a conventional CMP process.

FIG. 12 shows further metallization processing steps to form the SOI MOSFET structure 1200 with a reduced floating body effect in accordance with aspects of the invention. As shown in FIG. 12, through silicon vias (TSVs) 1205 are formed using conventional methods (e.g., photolithographic, etching followed by a damascene process) to form the TSVs 1205 and contact 1210. In embodiments, the TSVs 1205 connect contact 765 of wafer 2 with contact 155 of the flipped structure 600.

In accordance with aspects of the invention, the damaged pn junction in combination with the undamaged pn junction provides an asymmetrical junction leakage, which reduces threshold voltage (Vt) variation and/or Vt shifting. Thus, implementing the present invention provides for increased IC yields for SOI MOSFETs.

Design Flow

Figure 13:
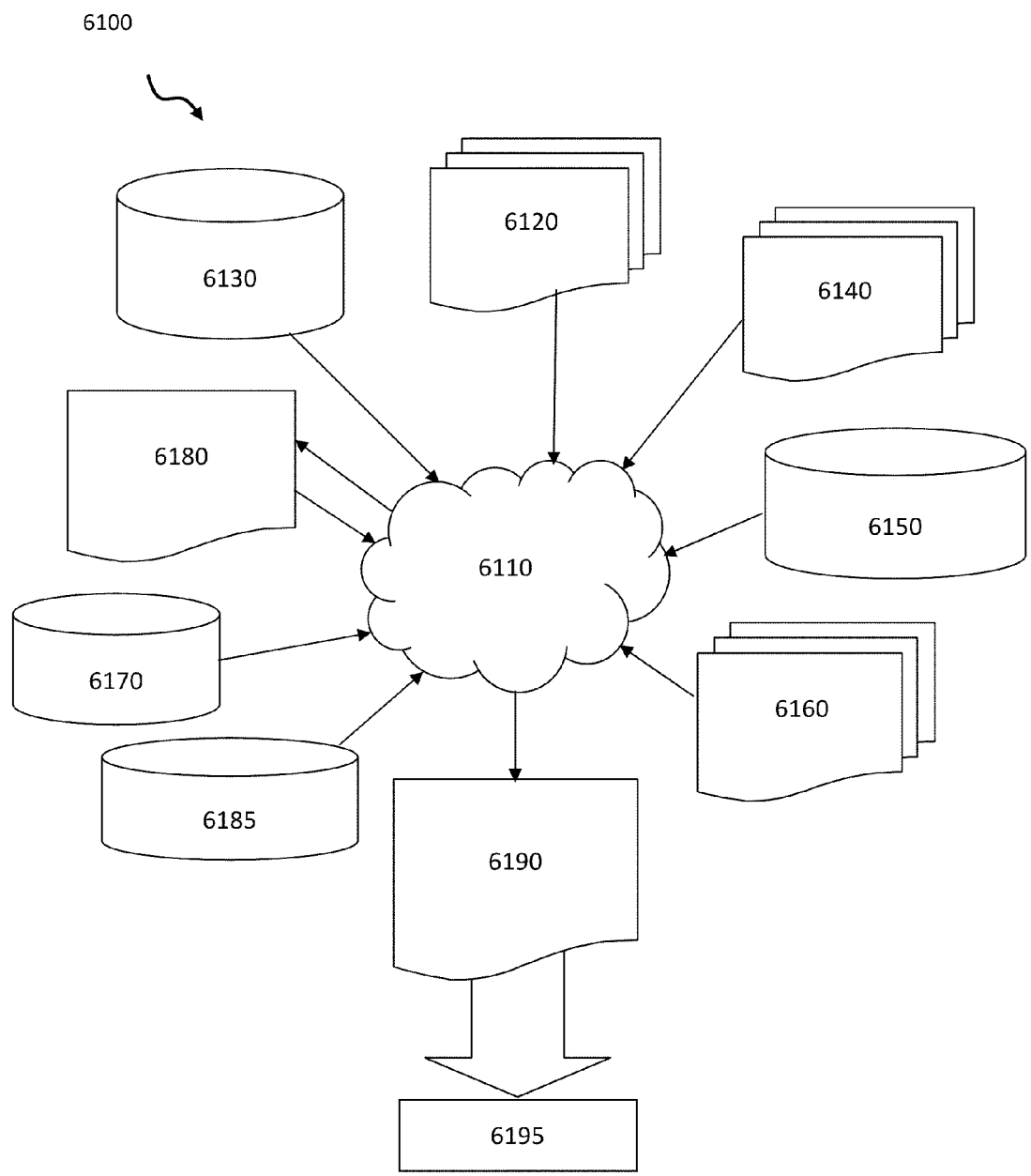
FIG. 13 is a flow diagram of a design process used in semiconductor design, manufacturing, and/or testing.

FIG. 13 shows a block diagram of an exemplary design flow 6100 used for example, in semiconductor design, manufacturing, and/or test. Design flow 6100 may vary depending on the type of IC being designed. For example, a design flow 6100 for building an application specific IC (ASIC) may differ from a design flow 6100 for designing a standard component or from a design from 6100 for instantiating the design into a programmable array, for example a programmable gate array (PGA) or a field programmable gate array (FPGA) offered by Altera® Inc. or Xilinx® Inc. (Altera is a registered trademark of Altera Corporation in the United States, other countries, or both. Xilinx is a registered trademark of Xilinx, Inc. in the United States, other countries, or both.) Design structure 6120 is preferably an input to a design process 6110 and may come from an IP provider, a core developer, or other design company or may be generated by the operator of the design flow, or from other sources. Design structure 6120 comprises an embodiment of the invention as shown in FIGS. 1-12 in the form of schematics or HDL, a hardware-description language (e.g., VERILOG®, Very High Speed Integrated Circuit (VHSIC) Hardware Description Language (VHDL), C, etc.). (VERILOG is a registered trademark of Cadence Design Systems, Inc. in the United States, other countries, or both.) Design structure 6120 may be contained on one or more machine readable medium. For example, design structure 6120 may be a text file or a graphical representation of an embodiment of the invention as shown in FIGS. 1-12. Design process 6110 preferably synthesizes (or translates) an embodiment of the invention as shown in FIGS. 1-12 into a netlist 6180, where netlist 6180 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 6180 is resynthesized one or more times depending on design specifications and parameters for the circuit.

Design process 6110 may include using a variety of inputs; for example, inputs from library elements 6130 which may house a set of commonly used elements, circuits, and devices, including models, layouts, and symbolic representations, for a given manufacturing technology (e.g., different technology nodes, 32 nm, 45 nm, 90 nm, etc.), design specifications 6140, characterization data 6150, verification data 6160, design rules 6170, and test data files 6185 (which may include test patterns and other testing information). Design process 6110 may further include, for example, standard circuit design processes such as timing analysis, verification, design rule checking, place and route operations, etc. One of ordinary skill in the art of integrated circuit design can appreciate the extent of possible electronic design automation tools and applications used in design process 6110 without deviating from the scope and spirit of the invention. The design structure of the invention is not limited to any specific design flow.

Design process 6110 preferably translates an embodiment of the invention as shown in FIGS. 1-12, along with any additional integrated circuit design or data (if applicable), into a second design structure 6190. Design structure 6190 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 6190 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-12. Design structure 6190 may then proceed to a stage 6195 where, for example, design structure 6190: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method of making an integrated circuit (IC) structure, comprising:
   providing a silicon on insulator (SOT) substrate;
   forming at least one metal oxide semiconductor field effect transistor (MOSFET) on the SOI substrate;
   forming an asymmetrical source-drain junction in the at least one MOSFET by damaging a pn junction to reduce floating body effects of the at least one MOSFET;
   forming an oxide layer on the SOI substrate;
   depositing a poly-Si layer on the oxide layer;
   depositing a nitride layer on the poly-Si layer;
   patterning a gate by etching portions of the poly-Si layer and the nitride layer;
   forming spacers on sides of the gate;
   etching portions of the oxide layer using the nitride layer and the spacers as a mask;
   etching portions of an epitaxial Si layer of the SOI substrate using the nitride layer and the spacers as a mask;
   etching portions of an epitaxial SiGe layer of the SOI substrate using the nitride layer and the spacers as a mask;
   depositing a second epitaxial Si layer surrounding a remaining portion of the epitaxial SiGe layer, a remaining portion of the epitaxial Si layer and planar with an upper surface of a remaining portion of the oxide layer;
   etching a Si layer of the SOI substrate to expose the epitaxial SiGe layer;
   planarizing the epitaxial SiGe layer;
   etching portions of the epitaxial SiGe layer; and
   etching portions of the second epitaxial Si layer.

2. The method of claim 1, further comprising:
   flipping the at least one MOSFET; and
   bonding the at least one MOSFET to another MOSFET.

3. A method of making an integrated circuit (IC) structure, comprising:
   providing a silicon on insulator (SOI) substrate;
   forming at least one metal oxide semiconductor field effect transistor (MOSFET) on the SOI substrate;

forming an asymmetrical source-drain junction in the at least one MOSFET by damaging a pn junction to reduce floating body effects of the at least one MOSFET;
forming an oxide layer on the SOI substrate;
depositing a poly-Si layer on the oxide layer;
depositing a nitride layer on the poly-Si layer;
patterning a gate by etching portions of the poly-Si layer and the nitride layer;
forming spacers on sides of the gate;
etching portions of the oxide layer using the nitride layer and the spacers as a mask;
etching portions of an epitaxial Si layer of the SOI substrate using the nitride layer and the spacers as a mask;
etching portions of an epitaxial SiGe layer of the SOI substrate using the nitride layer and the spacers as a mask;
depositing a second epitaxial Si layer surrounding a remaining portion of the epitaxial SiGe layer and a remaining portion of the epitaxial Si layer and planar with a remaining portion of the oxide layer;
flipping the at least one MOSFET;
bonding the at least one MOSFET to another MOSFET;
etching a Si layer of the SOT substrate to expose the epitaxial SiGe layer;
planarizing the epitaxial SiGe layer;
etching portions of the epitaxial SiGe layer; and
etching portions of the second epitaxial Si layer.

4. The method of claim 3, further comprising:
forming a mask over one side of the flipped at least one MOSFET; and
implanting Ge to a portion of the at least one MOSFET exposed by the mask to form a damaged pn junction.

5. The method of claim 4, wherein the implanting Ge creates a modified epitaxial SiGe layer portion and a modified second epitaxial Si layer portion.

6. The method of claim 4, further comprising:
depositing a second oxide layer over the epitaxial SiGe layer and the second epitaxial Si layer; and
planarizing the second oxide layer.

7. The method of claim 6, further comprising building at least one through silicon via (TSVs) providing electrical contact between the at least one MOSFET and the another MOSFET.

8. A method comprising:
forming at least one metal oxide semiconductor field effect transistor (MOSFET) on a silicon on insulator (SOI) substrate;
masking a portion of the at least one MOSFET;
implanting a dopant in an unmasked portion of the MOSFET to form an asymmetrical source-drain junction in the at least one MOSFET structured to reduce floating body effects of the at least one MOSFET;
forming an oxide layer on the SOI substrate;
depositing a poly-Si layer on the oxide layer;
depositing a nitride layer on the poly-Si layer;
patterning a gate by etching portions of the poly-Si layer and the nitride layer;
forming spacers on sides of the gate;
etching portions of the oxide layer;
etching portions of an epitaxial Si layer of the SOI substrate;
etching portions of an epitaxial SiGe layer of the SOI substrate;
depositing a second epitaxial Si layer surrounding a remaining portion of the epitaxial SiGe layer, a remaining portion of the epitaxial Si layer and a remaining portion of the oxide layer;
etching a Si layer of the SOI substrate to expose the epitaxial SiGe layer;
etching portions of the epitaxial SiGe layer; and
etching portions of the second epitaxial Si layer.

9. The method of claim 8, further comprising bonding the at least one MOSFET to a top side of another MOSFET, wherein the asymmetrical source-drain junction:
comprises a damaged pn junction; and
provides for at least one of reduced threshold voltage (Vt) variation and reduced Vt shifting with the damaged pn junction.

10. The method of claim 8, further comprising planarizing the epitaxial SiGe layer, and wherein:
the etching portions of the oxide layer uses the nitride layer and the spacers as a mask;
the etching portions of the epitaxial Si layer of the SOI substrate uses the nitride layer and the spacers as a mask;
the etching portions of the epitaxial SiGe layer of the SOT substrate uses the nitride layer and the spacers as a mask;
flipping the at least one MOSFET; and
bonding the at least one MOSFET to another MOSFET.

11. The method of claim 10, wherein the second epitaxial Si layer is planar with the remaining portion of the oxide layer.

12. The method of claim 11, wherein the second epitaxial Si layer is planar with an upper surface of the remaining portion of the oxide layer.

* * * * *